(12) United States Patent
Lee et al.

(10) Patent No.: US 12,237,297 B2
(45) Date of Patent: Feb. 25, 2025

(54) SOLDER REFLOW APPARATUS AND METHOD OF MANUFACTURING AN ELECTRONIC DEVICE

(71) Applicant: SAMSUNG ELECTRONICS CO., LTD., Suwon-si (KR)

(72) Inventors: Junga Lee, Suwon-si (KR); Youngja Kim, Suwon-si (KR); Hyunki Kim, Suwon-si (KR); Youngmin Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 44 days.

(21) Appl. No.: 18/127,513

(22) Filed: Mar. 28, 2023

(65) Prior Publication Data

US 2024/0047411 A1 Feb. 8, 2024

(30) Foreign Application Priority Data

Aug. 3, 2022 (KR) .................. 10-2022-0096830

(51) Int. Cl.
*B23K 3/00* (2006.01)
*B23K 1/00* (2006.01)
(Continued)

(52) U.S. Cl.
CPC ............ *H01L 24/75* (2013.01); *B23K 1/0016* (2013.01); *B23K 1/015* (2013.01); *B23K 3/047* (2013.01);
(Continued)

(58) Field of Classification Search
CPC ...... B23K 3/08; B23K 2101/36; B23K 1/008;
B23K 2101/42; B23K 3/00; B23K 3/04;
B23K 1/0016; B23K 1/015; B23K 3/047;
B23K 3/087; B23K 2101/40; H05K
3/3494; H01L 2224/81024; H01L
2224/81092; H01L 2224/81095; H01L
2224/81211;
(Continued)

(56) References Cited

U.S. PATENT DOCUMENTS 2,943,181 A * 6/1960 Gunow .................. B23K 35/38
228/217
4,077,467 A 3/1978 Spigarelli
(Continued)

FOREIGN PATENT DOCUMENTS

CN 101530954 A * 9/2009 ........... B23K 1/0014
CN 107838516 A * 3/2018 ............. B23K 1/008
(Continued)

*Primary Examiner* — Kiley S Stoner
(74) *Attorney, Agent, or Firm* — Sughrue Mion, PLLC

(57) ABSTRACT

An apparatus includes: a vapor generating chamber configured to accommodate a heat transfer fluid and to be filled with saturated vapor generated by the heat transfer fluid; a heater configured to heat the heat transfer fluid in the vapor generating chamber; a substrate stage configured to be movable upward or downward in the vapor generating chamber and to support a substrate on which an electronic device is mounted via a solder. The apparatus also includes at least one mesh plate extending in a horizontal direction in the vapor generating chamber. The at least one mesh plate includes a plurality of openings through which the vapor moves.

19 Claims, 17 Drawing Sheets

(51) Int. Cl.
*B23K 1/015* (2006.01)
*B23K 3/047* (2006.01)
*B23K 3/08* (2006.01)
*H01L 23/00* (2006.01)
*B23K 101/40* (2006.01)

(52) U.S. Cl.
CPC ............ *B23K 3/08* (2013.01); *B23K 2101/40* (2018.08); *H01L 2224/75272* (2013.01); *H01L 2224/75804* (2013.01)

(58) Field of Classification Search
CPC . H01L 2224/81395; H01L 2224/81815; H01L 2224/81908; H01L 2224/95092; H01L 2224/97; H01L 2924/014; H01L 2924/20104; H01L 2924/20105; H01L 2924/20106; H01L 2224/75101; H01L 2224/75251; H01L 2224/75824; H01L 2224/8121; H01L 23/3121; H01L 24/75; H01L 24/81; H01L 24/97; H01L 21/561; H01L 24/13; H01L 24/16; H01L 2224/13111; H01L 2224/13139; H01L 2224/13147; H01L 2224/16227; H01L 2224/75272; H01L 2224/75804; H01L 2224/759; H01L 2224/7598; H01L 2224/75984
USPC ........... 228/234.2, 49.5, 44.7, 179.1–180.22, 228/218–221, 42
See application file for complete search history.

(56) References Cited

U.S. PATENT DOCUMENTS

| | | | |
|---|---|---|---|
| 4,558,524 A | 12/1985 | Peck et al. | |
| 4,580,716 A * | 4/1986 | Barresi | B23K 35/386 228/180.1 |
| 4,612,712 A * | 9/1986 | Pescatore | B23K 1/015 228/180.1 |
| 4,735,001 A * | 4/1988 | Mishina | B23K 1/015 118/729 |
| 5,038,496 A * | 8/1991 | Mishina | B23K 1/015 34/78 |
| 5,146,694 A * | 9/1992 | Mishina | B23K 1/015 432/19 |
| 5,623,123 A * | 4/1997 | Umehara | H01L 23/49503 29/841 |
| 7,748,600 B2 | 7/2010 | Leicht | |
| 8,360,305 B2 | 1/2013 | Davies | |
| 10,875,114 B2 | 12/2020 | Nagai et al. | |
| 2003/0207213 A1 * | 11/2003 | Farnworth | G03F 7/0037 430/315 |
| 2004/0178251 A1 * | 9/2004 | Trucco | H05K 3/3485 228/248.1 |
| 2007/0057020 A1 * | 3/2007 | Shibamura | B23K 3/08 228/101 |
| 2009/0230176 A1 * | 9/2009 | Takahashi | B23K 26/0676 228/256 |
| 2010/0012705 A1 * | 1/2010 | Nakamura | B23K 1/0016 228/19 |
| 2010/0012709 A1 * | 1/2010 | Nikaido | B23K 3/08 228/19 |
| 2013/0175323 A1 * | 7/2013 | Zhang | B23K 1/206 228/4.1 |

FOREIGN PATENT DOCUMENTS

| | | | | |
|---|---|---|---|---|
| CN | 107855622 A | * | 3/2018 | ............ B23K 1/008 |
| CN | 107855623 A | * | 3/2018 | ........... B23K 1/0016 |
| CN | 107931768 A | * | 4/2018 | ........... B23K 1/0016 |
| CN | 107963443 A | * | 4/2018 | ........... B23K 1/0016 |
| CN | 106029276 B | * | 3/2019 | ............. B01D 46/30 |
| CN | 110385497 A | * | 10/2019 | |
| CN | 113613408 A | * | 11/2021 | |
| CN | 114147313 A | * | 3/2022 | |
| CN | 115332892 A | * | 11/2022 | |
| DE | 4404263 B4 | * | 12/2007 | ............ B23K 1/008 |
| DE | 202009014591 U1 | * | 3/2010 | ........... B23K 1/0016 |
| EP | 0145969 A2 | * | 6/1985 | |
| EP | 0218391 A1 | * | 4/1987 | |
| EP | 0757386 A2 | * | 2/1997 | |
| EP | 1036626 A2 | * | 9/2000 | ............ B23K 1/015 |
| EP | 3791946 A1 | * | 3/2021 | |
| EP | 3851235 A1 | * | 7/2021 | ............ B23K 1/015 |
| JP | 2509935 B2 | * | 6/1996 | ............ B23K 1/015 |
| JP | H11163036 A | * | 6/1999 | |
| JP | 2003037345 A | * | 2/2003 | ............ H01L 24/97 |
| JP | 3529633 B2 | | 3/2004 | |
| JP | 2007273571 A | * | 10/2007 | ............ B23K 1/008 |
| JP | 2007329376 A | * | 12/2007 | ........... B23K 1/0016 |
| KR | 20020061482 A | * | 4/2002 | |
| TW | 201110295 A | * | 3/2011 | .......... B23K 1/0008 |
| TW | 201428867 A | * | 7/2014 | .......... B23K 3/0623 |
| WO | WO-9726107 A1 | * | 7/1997 | ............ B23K 1/008 |
| WO | WO-03106093 A2 | * | 12/2003 | ............ B23K 1/015 |
| WO | WO-2012070264 A1 | * | 5/2012 | ........... B23K 1/0016 |
| WO | WO-2016104710 A1 | * | 6/2016 | ............ B23K 1/002 |

* cited by examiner

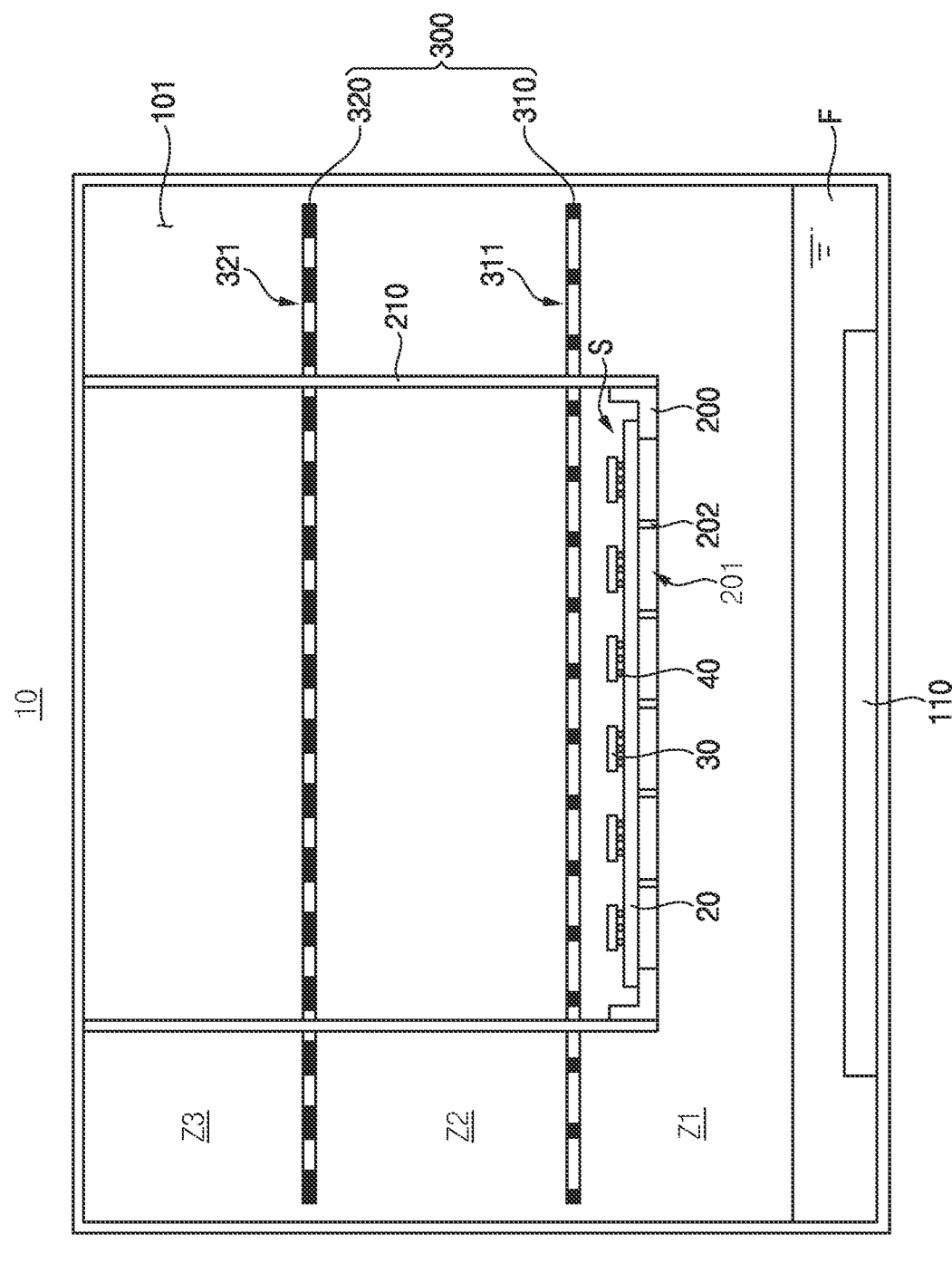

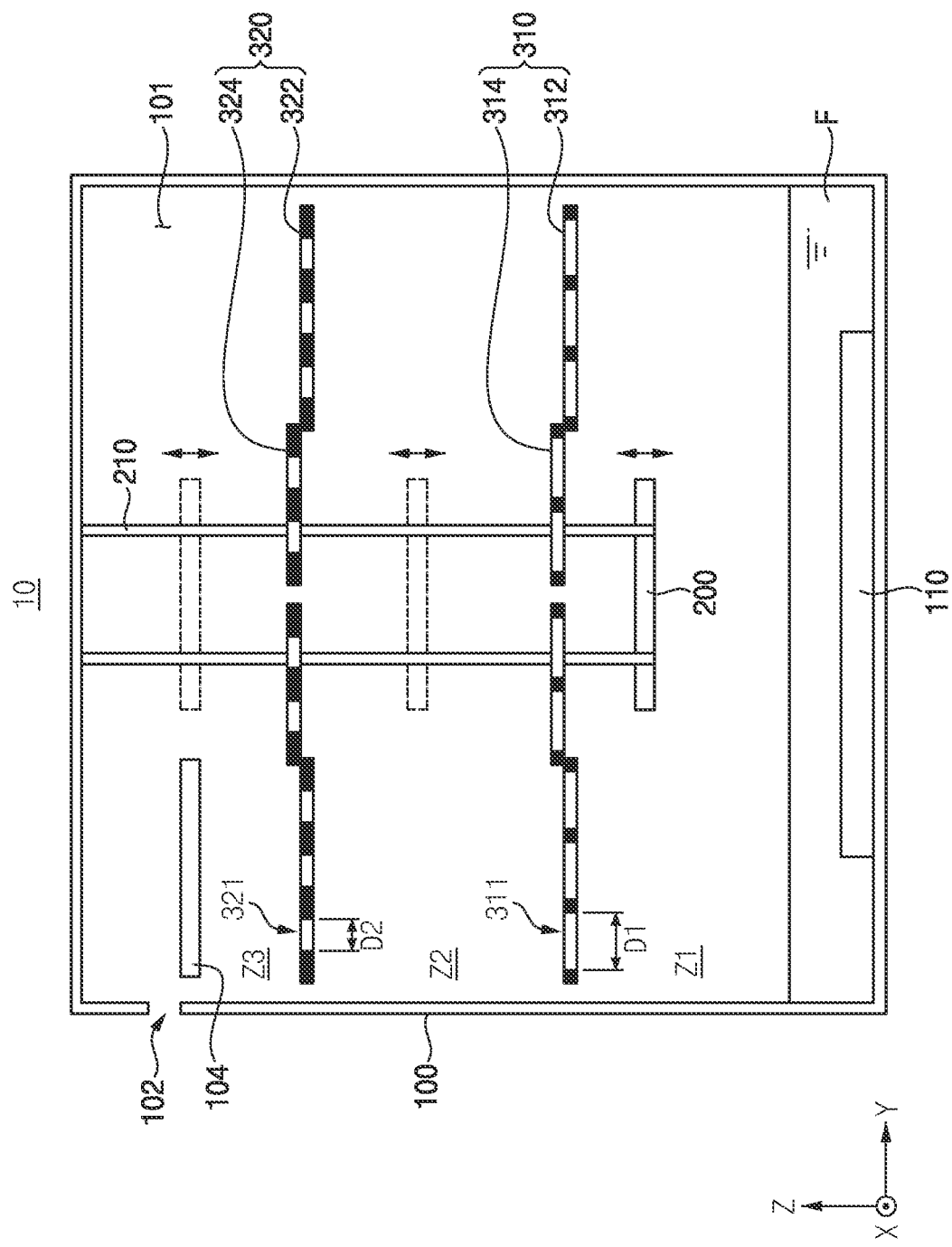

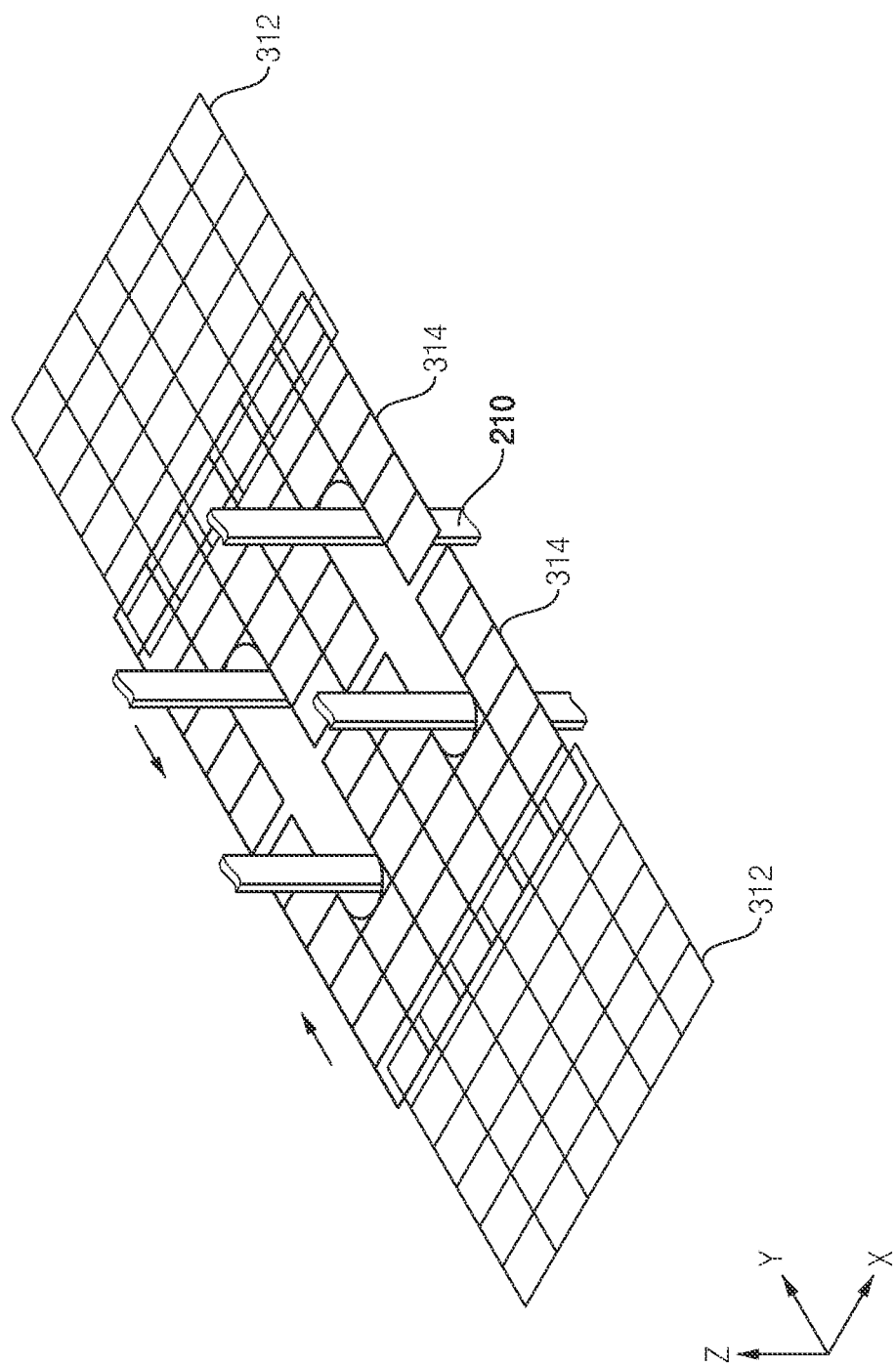

SOLDER REFLOW APPARATUS AND METHOD OF MANUFACTURING AN ELECTRONIC DEVICE

CROSS-REFERENCE TO RELATED APPLICATION

This application claims priority under 35 U.S.C. § 119 to Korean Patent Application No. 10-2022-0096830, filed on Aug. 3, 2022 in the Korean Intellectual Property Office (KIPO), the contents of which are herein incorporated by reference in their entirety.

BACKGROUND

1. Field

The present disclosure relates to a solder reflow apparatus and a method of manufacturing an electronic device using the same. More particularly, the present disclosure relates to a solder reflow apparatus using a vapor phase solder method and a method of manufacturing a semiconductor package using the same.

2. Description of the Related Art

A convection reflow method, a laser assisted bonding method, a vapor phase soldering method, or the like may be used to solder a solder paste in the field of Surface Mount Technology (SMT). In a case of the vapor phase soldering method, it may be possible to provide a uniform temperature distribution over the entire substrate such as a Printed Circuit Board (PCB) during saturation of vapor inside an oven, and because the boiling point of a heat transfer fluid is predetermined, there are advantages of preventing overheating by setting the target temperature high.

However, since the vapor density gradient varies according to a height inside the oven and a temperature gradient varies accordingly, as the pitch between solders is decreased, it may be difficult to precisely control the temperature profile suitable for soldering.

SUMMARY

The present disclosure provides a solder reflow apparatus capable of precisely controlling a temperature profile suitable for soldering. The present disclosure provides a method of manufacturing an electronic device using the above solder reflow apparatus.

According to an aspect of the present disclosure, an apparatus includes: a vapor generating chamber configured to accommodate a heat transfer fluid and to be filled with saturated vapor generated by the heat transfer fluid; a heater configured to heat the heat transfer fluid in the vapor generating chamber; a substrate stage configured to be movable upward or downward in the vapor generating chamber and to support a substrate on which an electronic device is mounted via a solder. The apparatus also includes at least one mesh plate extending in a horizontal direction in the vapor generating chamber. The at least one mesh plate includes a plurality of openings through which the vapor moves.

According to another aspect of the present disclosure, an apparatus includes: a vapor generating chamber configured to have a heat transfer fluid on a bottom of the vapor generating chamber; a heater configured to heat the heat transfer fluid to generate saturated vapor from the heat transfer liquid; a substrate stage configured to be movable upward or downward in the vapor generating chamber and to support a substrate on which an electronic device is mounted via a solder. A temperature gradient regulator includes a first plate and a second plate that are sequentially arranged from the bottom of the vapor generating chamber. The first plate includes a plurality of first openings that have a first size, and the second plate includes a plurality of second openings that have a second size smaller than the first size.

According to another aspect of the present disclosure, an apparatus includes: a vapor generating chamber configured to have a heat transfer fluid and in which a saturated vapor generated from the heat transfer fluid is distributed based on a density difference; a heater configured to heat the heat transfer fluid in the vapor generating chamber; a substrate stage configured to be movable upward or downward in the vapor generating chamber and to support a substrate on which an electronic device is mounted via a solder. The apparatus also includes at least one mesh plate extending in a horizontal direction in the vapor generating chamber. The at least one mesh plate includes a plurality of openings through which the vapor moves and a plurality of cover members that are operable in a retractable manner to allow movement of the substrate stage.

Accordingly, it may be possible to obtain a desired temperature gradient by controlling the vapor density in a plurality of the zones divided along a vertical direction in the vapor generating chamber. Thus, defects in a reflow process for solders arranged at a fine pitch may be reduced and joint quality may be improved.

BRIEF DESCRIPTION OF THE DRAWINGS

The above and other aspects, features, and advantages of certain embodiments of the present disclosure will be more apparent from the following description taken in conjunction with the accompanying drawings, in which:

FIG. 1 is a cross-sectional view illustrating a solder reflow apparatus in accordance with example embodiments;

FIG. 2 is a side view illustrating the solder reflow apparatus of FIG. 1;

FIG. 3A is a perspective view illustrating a closed state of a first mesh plate of the solder reflow apparatus of FIG. 1;

DETAILED DESCRIPTION

Hereinafter, example embodiments will be explained in detail with reference to the accompanying drawings.

Figure 3B:
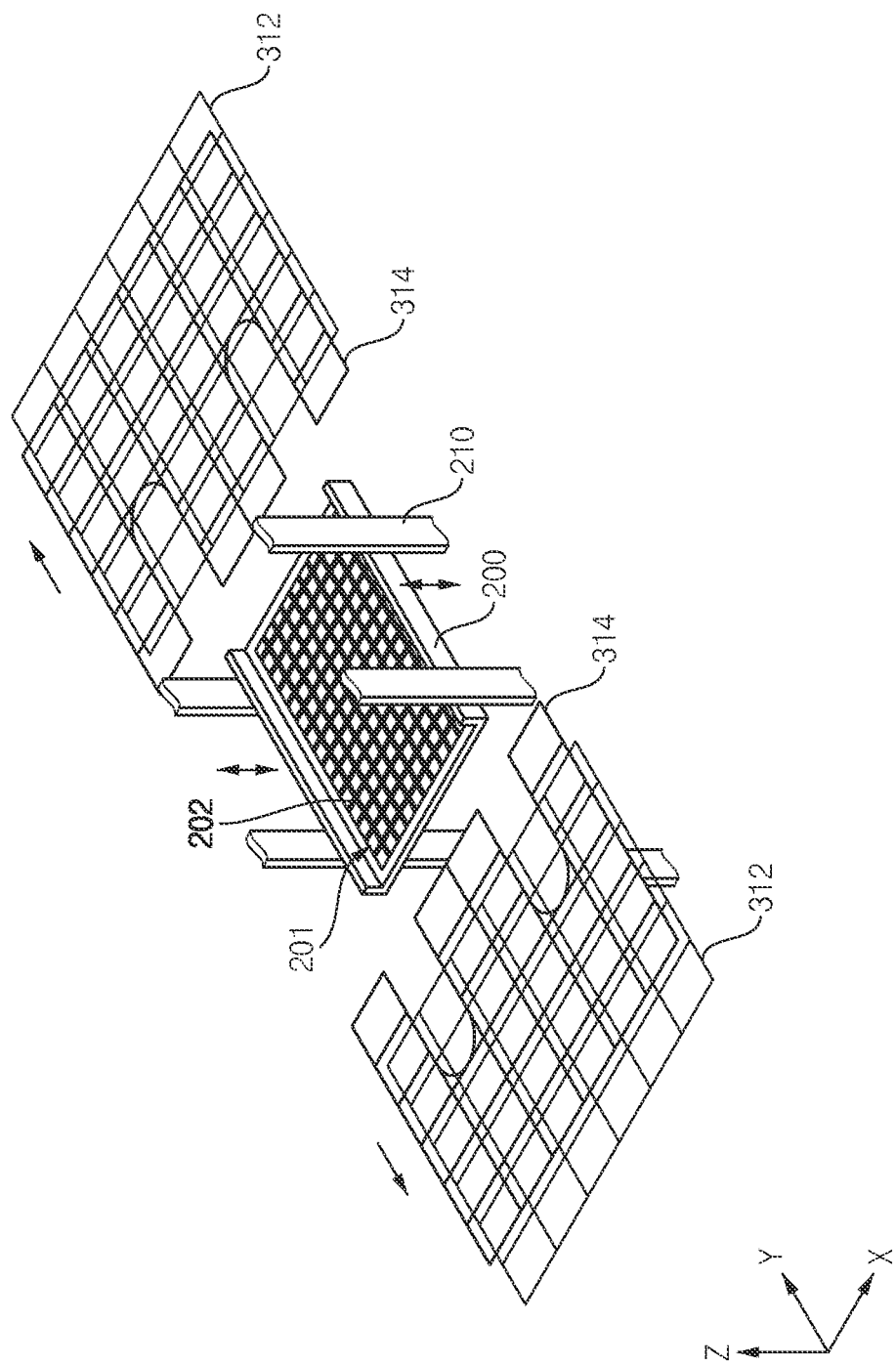
FIG. 3B is a perspective view illustrating an open state of the first mesh plate of FIG. 3A.
Figure 4:
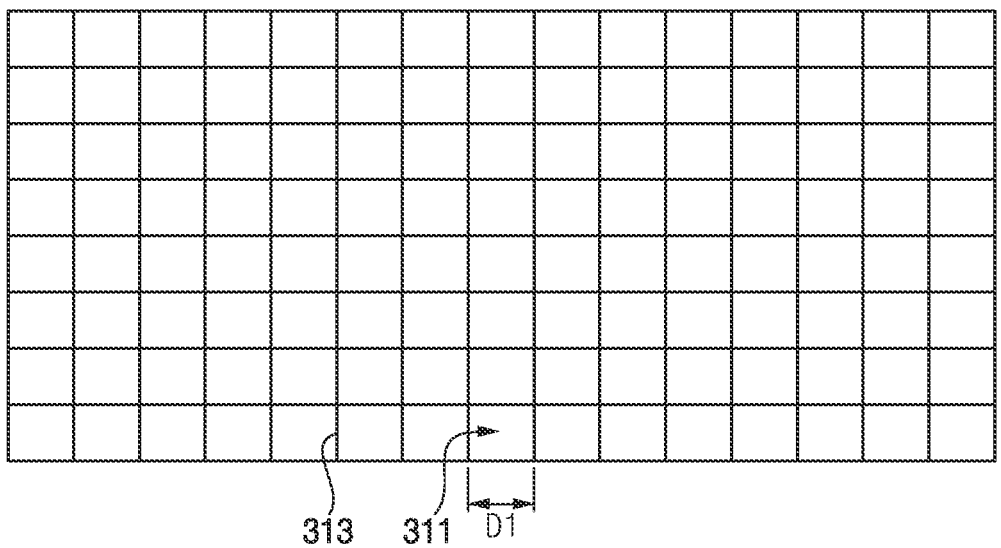
FIG. 4 is a plan view illustrating a first cover member of the first mesh plate of FIG. 1.
Figure 5:
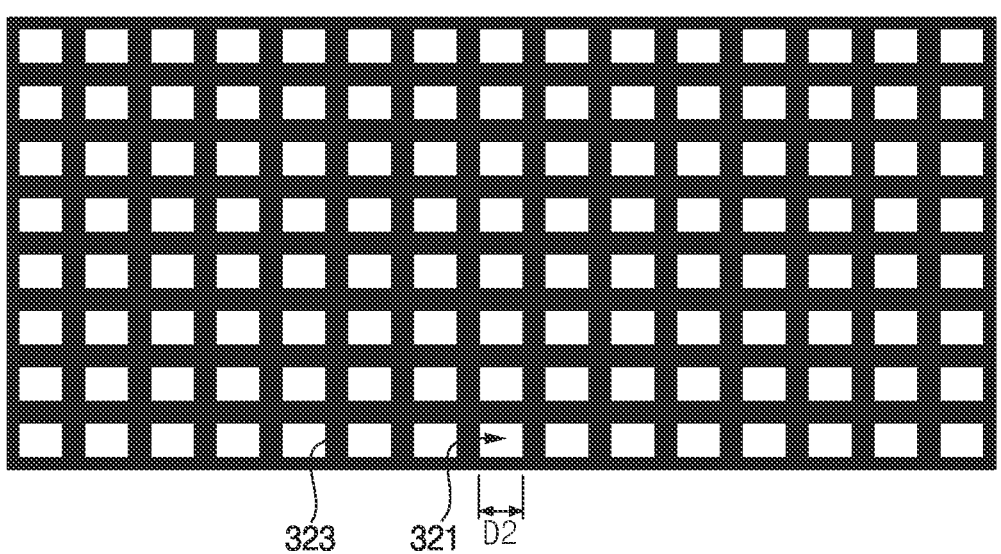
FIG. 5 is a plan view illustrating a second cover member of the second mesh plate of FIG. 1.
Figure 6:
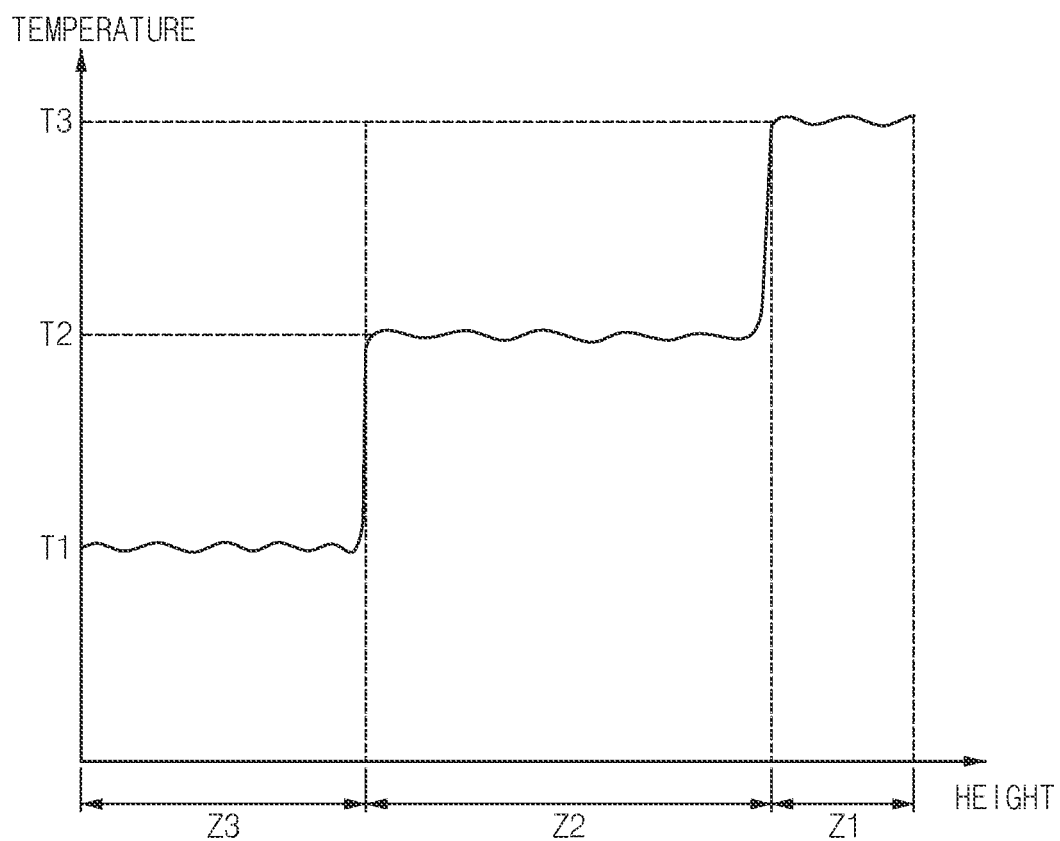
FIG. 6 is a graph illustrating a temperature profile in a vapor generating chamber of FIG. 1.
Figure 7:
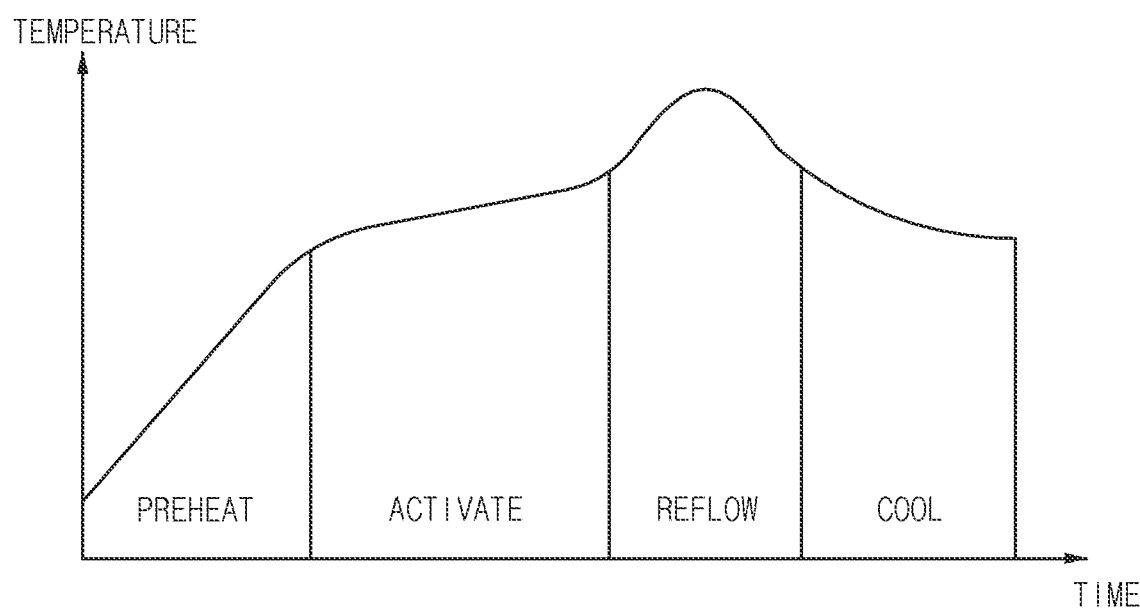
FIG. 7 is a graph illustrating a soldering profile in the vapor generating chamber of FIG. 1.

FIG. 1 is a cross-sectional view illustrating a solder reflow apparatus in accordance with example embodiments. FIG. 2 is a side view illustrating the solder reflow apparatus of FIG. 1. FIG. 3A is a perspective view illustrating a closed state of a first mesh plate of the solder reflow apparatus of FIG. 1, and FIG. 3B is a perspective view illustrating an open state of the first mesh plate of FIG. 3A. FIG. 4 is a plan view illustrating a first cover member of the first mesh plate of FIG. 1. FIG. 5 is a plan view illustrating a second cover member of the second mesh plate of FIG. 1. FIG. 6 is a graph illustrating a temperature profile in a vapor generating chamber of FIG. 1. FIG. 7 is a graph illustrating a soldering profile in the vapor generating chamber of FIG. 1.

In FIGS. 1 to 7, a solder reflow apparatus 10 may include a vapor generating chamber 100 (shown in FIG. 2), a heater 110, a substrate stage 200, and a temperature gradient regulator 300. In addition, the solder reflow apparatus 10 may further include a lifting driver configured to raise and lower the substrate stage 200, an opening/closing driver configured to open and close the temperature gradient regulator 300, and a temperature sensing portion configured to monitor temperature in the vapor generating chamber 100. In example embodiments, the solder reflow apparatus 10 may be a vapor phase soldering apparatus configured to solder a solder paste by saturated vapor heated in the vapor generating chamber 100.

The vapor generating chamber 100 may include a lower reservoir having an oven shape to accommodate a heat transfer fluid F and to provide a space 101 filled with vapor generated directly above the fluid when the fluid F is boiling. The vapor generating chamber 100 may extend in a vertical direction (Z direction) by a predetermined height. In the vapor generating chamber 100, the heat transfer fluid may boil and the vapor may rise to the top, condense back to the liquid state at the top, and may flow back to the reservoir at the bottom.

The pressure inside the vapor generating chamber 100 may be maintained at atmospheric pressure. Alternatively, the vapor generating chamber 100 may be connected to an exhaust device such as a vacuum pump to adjust the pressure inside the vapor generating chamber 100. The pressure inside the vapor generating chamber may be maintained at a predetermined pressure in order to change the boiling point of the heat transfer fluid or soldering environments.

The heat transfer fluid F may be a chemical material that is selected to provide the vapor necessary for vapor phase soldering. The heat transfer fluid may be selected in consideration of boiling point, environmental influences, and corrosiveness of the generated vapor. The heat transfer fluid may include an inert organic liquid. For example, the heat transfer fluid may include a Perfluoropolyether (PFPEs)-based Galden solution. The boiling point of the Galden solution may be 230° C.

The heater 110 may heat the heat transfer fluid F accommodated in the vapor generating chamber 100 to generate saturated vapors. The heater 110 may include an electrical resistor that is immersed in the heat transfer fluid F on the bottom of the vapor generating chamber 100. Alternatively, the heater 110 may include a resistor in the form of a coil surrounding the reservoir tank. In addition or alternatively, a heater as a portion of a temperature control mechanism may be installed on a sidewall of the vapor generating chamber 100 to control the temperature of the vapor generating chamber 100 during a reflow process.

The substrate stage 200 may support an article S on which a solder process is performed in the vapor generating chamber 100. The substrate stage 200 may include a mesh type support structure for supporting the article S. The mesh type support structure may include support wires 202 that define a plurality of openings 201 through which the vapor moves. For example, the article S may include a substrate 20 on which an electronic component 30 is mounted via a solder 40.

The substrate stage 200 may be configured to be movable upward or downward within the vapor generating chamber 100. The lifting driver for moving the substrate stage 200 upward and downward may include various types of actuators such as a transfer rail, a transfer screw, a transfer belt, etc. Both end portions of the substrate stage 200 may be supported by transfer rods 210, respectively, and the substrate stage 200 may be moved up and down by the lifting driver.

As illustrated in FIG. 2, the article S for soldering may be transferred into the vapor generating chamber 100 through a gate 102 of the vapor generating chamber 100, and the article S may be loaded on the substrate stage 200 by a transfer mechanism 104 such as a guide rail or a transport pusher.

After the article S is loaded, the Galden solution F may be heated by the heater 110 and start to boil. The saturated vapor from the Galden solution may be distributed within the space 101 of the vapor generating chamber 100. At this time, the density of the saturated vapor may vary depending on the height, and thus a temperature gradient may be formed.

In example embodiments, the temperature gradient regulator 300 (shown in FIG. 1) may include at least one mesh plate (e.g., the first plate 310, the second plate 320) that extends in a horizontal direction (XY direction) within the vapor generating chamber 100. The mesh plate may have a plurality of openings through which the vapor is allowed to move. The temperature gradient regulator 300 may divide the space into an upper zone and a lower zone with the mesh plate interposed therebetween, and may adjust the density of the vapor in the upper zone and the lower zone. Accordingly, the upper zone may be controlled to be maintained at a first temperature and the lower zone may be controlled to be maintained at a second temperature higher than the first temperature.

The temperature gradient regulator 300 may include the first plate 310 and the second plate 320 sequentially disposed from the bottom of the vapor generating chamber 100. The first plate 310 and the second plate 320 may include a plurality of cover members that are operable in a retractable manner to allow movement of the substrate stage 200. In addition or alternatively, the first plate 310 and the second plate 320 may be spaced apart from an inner wall of the vapor generating chamber 100 by a predetermined distance.

As illustrated in FIGS. 2, 3A, and 3B, the first plate 310 may include a pair of first cover members 312 spaced apart from each other and second cover members 314 respectively installed to be movable on the first cover members 312 to allow the movement of the substrate stage 200. The first plate 310 may be installed at a first height from the bottom of the vapor generating chamber 100, and the second plate 320 may be installed at a second height higher than the first height from the bottom of the vapor generating chamber 100.

The opening/closing driver for opening/closing operations of the first plate 310 may include an actuator configured to move the second cover member 314 on the first cover member 312 in a first direction (Y direction). For example, the actuator may include a linear actuator such as a Linear Motion (LM) guide or a ball screw.

A pair of the second cover members 314 may move in a direction to get closer to each other to a closed position, to block the movement of the substrate stage 200 therebetween. A pair of the second cover members 314 may move away from each other to an open position, to allow the movement of the substrate stage 200 therebetween.

Similarly, the second plate 320 may include a pair of third cover members 322 spaced apart from each other and fourth cover members 324 respectively installed to be movable on the third cover members 322 to allow the movement of the substrate stage 200.

The opening/closing driver for opening/closing operations of the second plate 320 may include an actuator configured to move the fourth cover member 324 on the third cover member 322 in a first direction (Y direction). For example, the actuator may include a linear actuator such as a conveyance guide or a ball screw.

A pair of the fourth cover members 324 may move in a direction to get closer to each other to a closed position, to block the movement of the substrate stage 200 therebetween. A pair of the fourth cover members 324 may move away from each other to an open position, to allow the movement of the substrate stage 200 therebetween.

As illustrated in FIGS. 4 and 5, the first cover member 312 and the second cover member 314 of the first plate 310 may include a plurality of first openings 311 that have a first size D1, and the third cover member 322 and the fourth cover member 324 of the second plate 320 may include a plurality of second openings 321 that have a second size D2 smaller than the first size D1.

For example, the first cover member 312 may include first fine wires 313 that define a plurality of the first openings 311 allowing the movement of the vapor. The third cover member 322 may include second fine wires 323 that define a plurality of the second openings 321 allowing the movement of the vapor. A thickness of the first fine wire 313 may be greater than a thickness of the second fine wire 323.

The first openings and the second openings may have circular or polygonal shapes. The sizes and shapes of the first openings and the second openings, the thicknesses of the first fine wires and the second fine wires, etc. may be determined in consideration of the temperature profile in the zones divided by the first plate 310 and the second plate 320.

As illustrated in FIG. 6, a space above the second plate 320 may be defined as a third zone Z3 and may be maintained at a first temperature T1. A space between the first plate 310 and the second plate 320 may be defined as a second zone Z2 and may be maintained at a second temperature T2 higher than the first temperature T1. A space under the first plate 310 may be defined as a third zone Z1 and may be maintained at a third temperature T3 higher than the second temperature T2.

Temperatures of the first zone to the third zone may be determined in proportion to vapor density in each zone. Vapor density distribution in each zone may be determined according to the sizes of the first and second openings of the first plate 310 and the second plate 320, the thicknesses of the first and second fine wires, or the like.

For example, the first temperature T1 may be 100° C., the second temperature T2 may be 170° C., and the third temperature T3 may be 230° C. Temperatures in the first zone to the third zone may be determined in consideration of a temperature profile of soldering. The solder 40 may include Sn—Ag—Cu (SAC) solder, Sn—Ag solder, etc. Since the boiling point of the SAC solder is 217° C., the temperature T3 of the third zone Z1, which is a reflow section, may be maintained at 230° C.

As illustrated in FIG. 7, a soldering temperature profile corresponding to the temperature distribution of the first to third zones may be obtained during a solder reflow process. As the object S on the substrate stage 200 moves through the first to third zones Z1, Z2 and Z3 with time, a desired soldering temperature profile may be obtained.

Figure 8A:
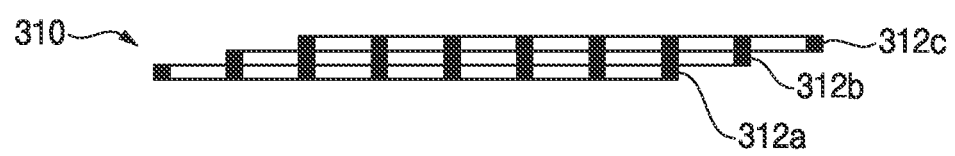
FIGS. 8A and 8B are cross-sectional views illustrating a first plate in accordance with example embodiments.
Figure 8B:
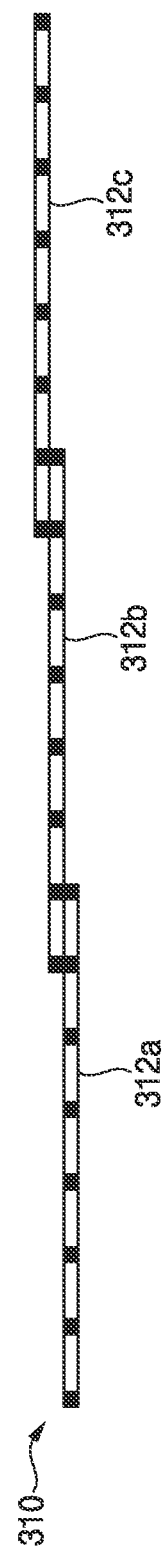
Figure 9:
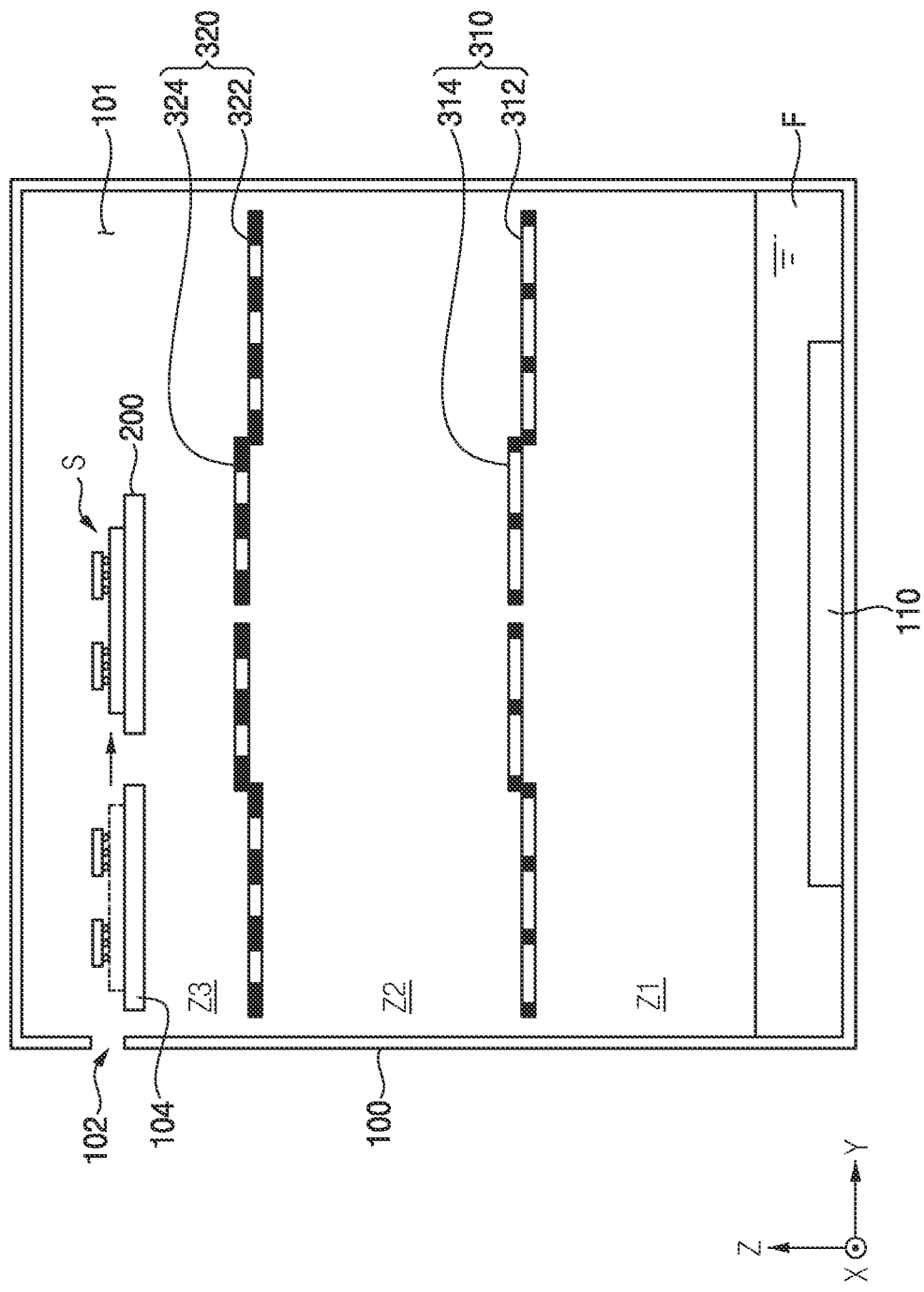
FIGS. 9 to 12 are cross-sectional views illustrating a method of performing a vapor phase reflow process in accordance with example embodiments.

FIGS. 8A and 8B are cross-sectional views illustrating a first plate in accordance with example embodiments. In FIGS. 8A and 8B, at least one mesh plate (e.g., the first plate 310) may include cover members 312a, 312b and 312c having a telescopic structure that operates in a retractable manner.

The first cover member 312a may be installed adjacent to a first sidewall of the vapor generating chamber 100, the second cover member 312b may be installed to be movable in a first direction on the first cover member 312a, and the third cover member 312c may be installed to be movable in the first direction on the second cover member 312b.

As illustrated in FIG. 8A, the second cover member 312b and the third cover member 312c may move to an open position adjacent to the first sidewall of the vapor generating chamber 100 to overlap each other, and thus, may allow the movement of the substrate stage 200 in the vertical direction.

As illustrated in FIG. 8B, the second cover member 312b and the third cover member 312c may move toward a second sidewall opposite to the first sidewall of the vapor generating chamber 100 to a closed position, and thus, may block the movement of the substrate stage 200 in the vertical direction. Hereinafter, a method of performing a vapor phase reflow process using the solder reflow apparatus of FIG. 1 will be described.

FIGS. 9 to 12 are cross-sectional views illustrating a method of performing a vapor phase reflow process in accordance with example embodiments. In FIGS. 9 to 12, an article S for soldering may be loaded into the vapor generating chamber 100, and the heat transfer fluid F in the vapor generating chamber 100 may be heated.

In example embodiments, a substrate 20 on which an electronic component 30 is mounted via a solder 40 may be transferred into the vapor generating chamber 100 through the gate 102 of the vapor generating chamber 100, and then, the article S may be loaded on the substrate stage 200 by the transfer mechanism 104 such as a guide rail or a transfer pusher.

After the article S is loaded, the Galden solution F may be heated by the heater 110 and start to boil. The saturated vapor from the Galden solution may be distributed within the space 101 of the vapor generating chamber 100. At this time, the vapor may be distributed into the first to third zones Z1, Z2 and Z3 through the first and second openings of the first plate 10 and the second plate 320, respectively, and have a desired constant density in each zone.

Thus, the third zone Z3 above the second plate 320 may be maintained at the first temperature T1, the second zone Z2 between the first plate 310 and the second plate 320 may be maintained at the second temperature T2 higher than the first temperature T1, and the third zone Z1 under the first plate 310 may be maintained at the third temperature T3 higher than the second temperature T3.

Figure 10:
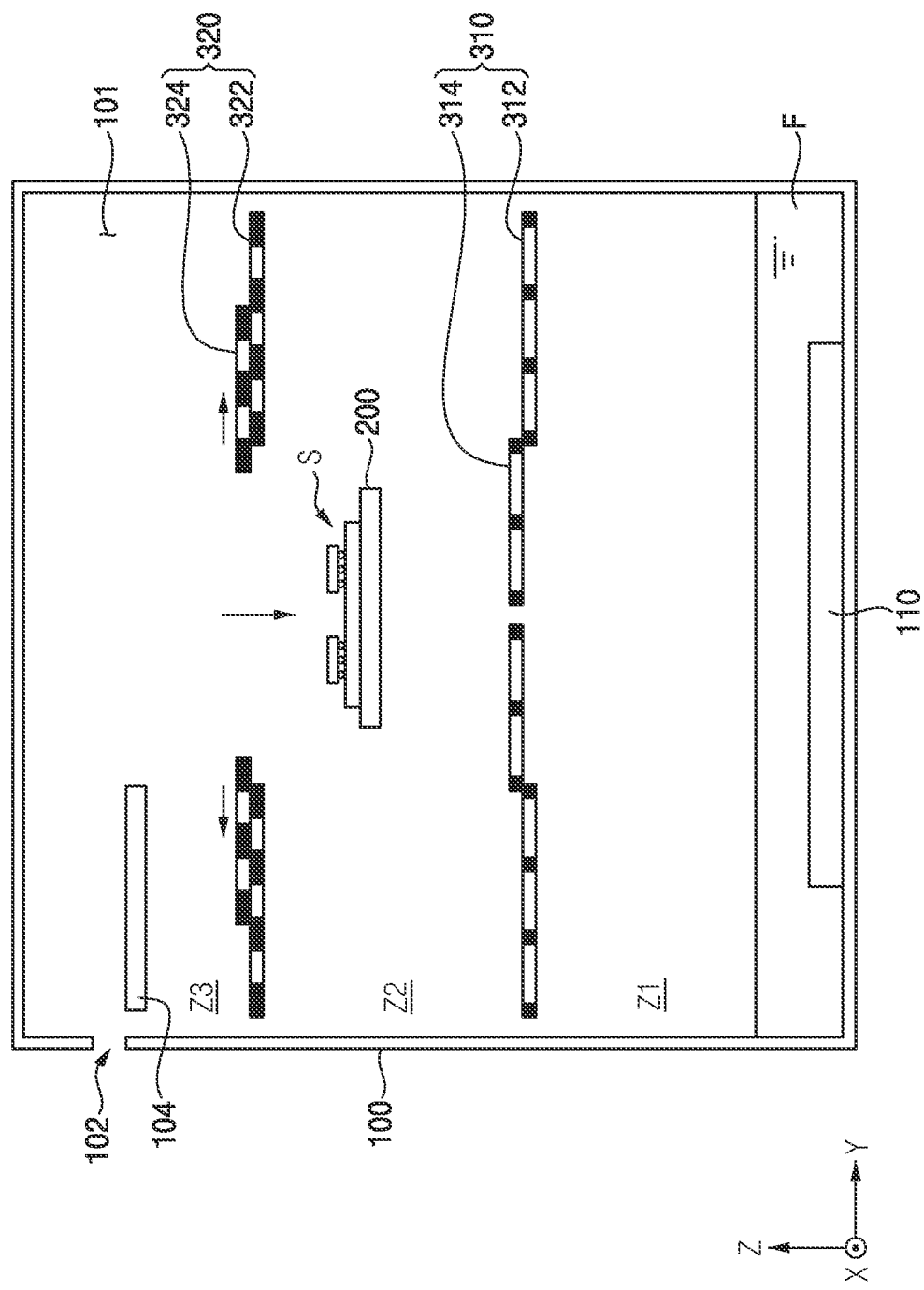

As illustrated in FIG. 10, after the article S is preheated in the first zone Z3, the article may be moved to the second zone Z2 and activated (soaked). The substrate 20 may be preheated to prevent various soldering defects and to provide a more solid and conductive joint. There may be a secondary vapor phase which is produced at a cooler temperature than the main vapor layer in the first and second zones Z3 and Z3. No soldering takes place in this zone, only a temperature rises.

Figure 11:
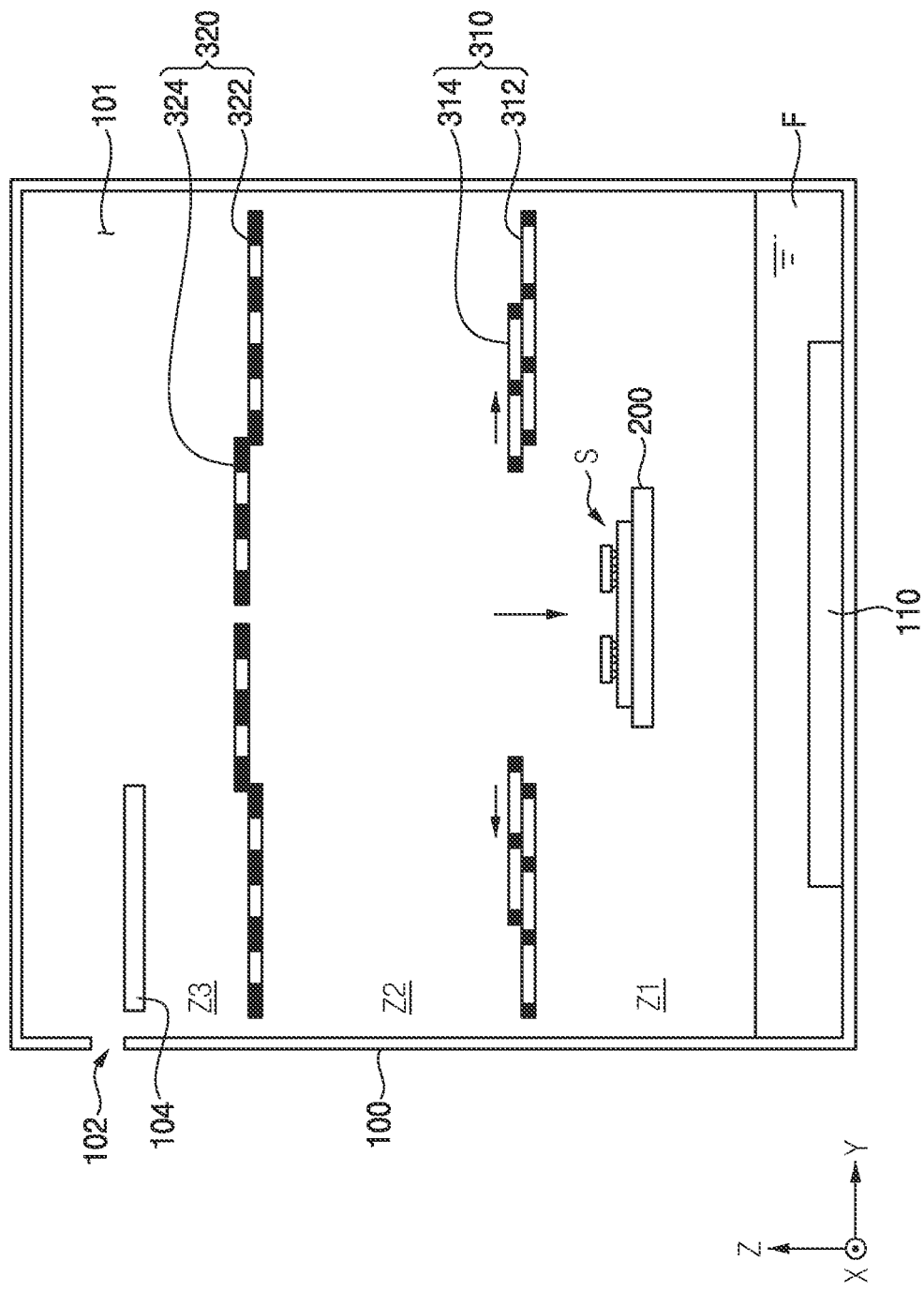
Figure 12:
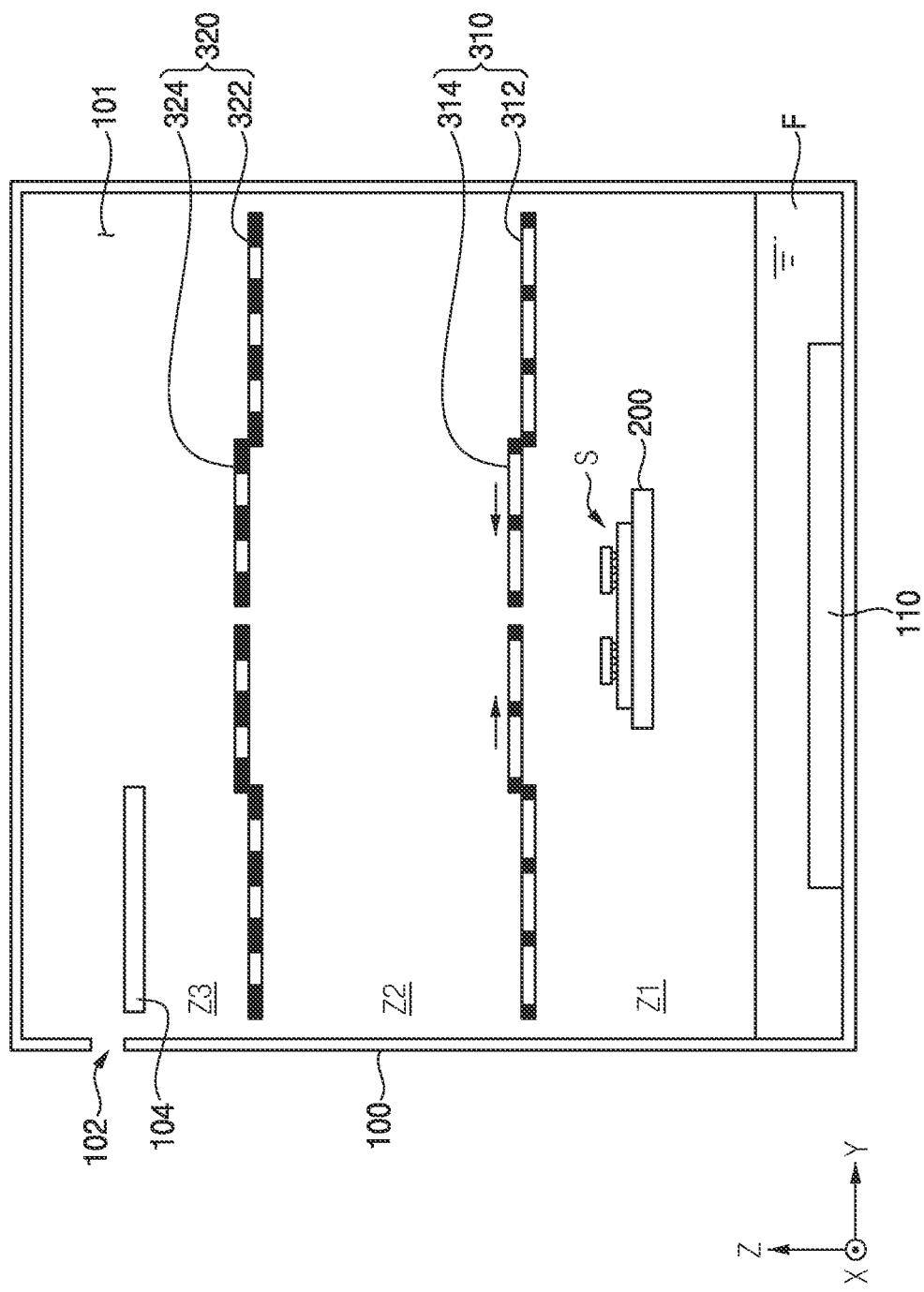

As illustrated in FIGS. 11 and 12, the article S may be moved to the third zone Z1 so that the solder 40 may be reflowed. When the article S is immersed in the vapor in the third zone Z1, the vapor may serves as a heat transfer medium. Since the temperature of the vapor and the temperature of the substrate 20 in the third zone Z1 are different from each other, vapor may be condensed on a surface of the article S to form a layer. The vapor condensing on the surface may transfer latent heat to the surface of the substrate 20 during condensation to reflow a solder paste. Then, after the solder 40 is soldered, the article S may move to the first zone Z3 via the second zone Z2 and then may be cooled. Accordingly, the solder joints may be cooled down and solidified.

Figure 13:
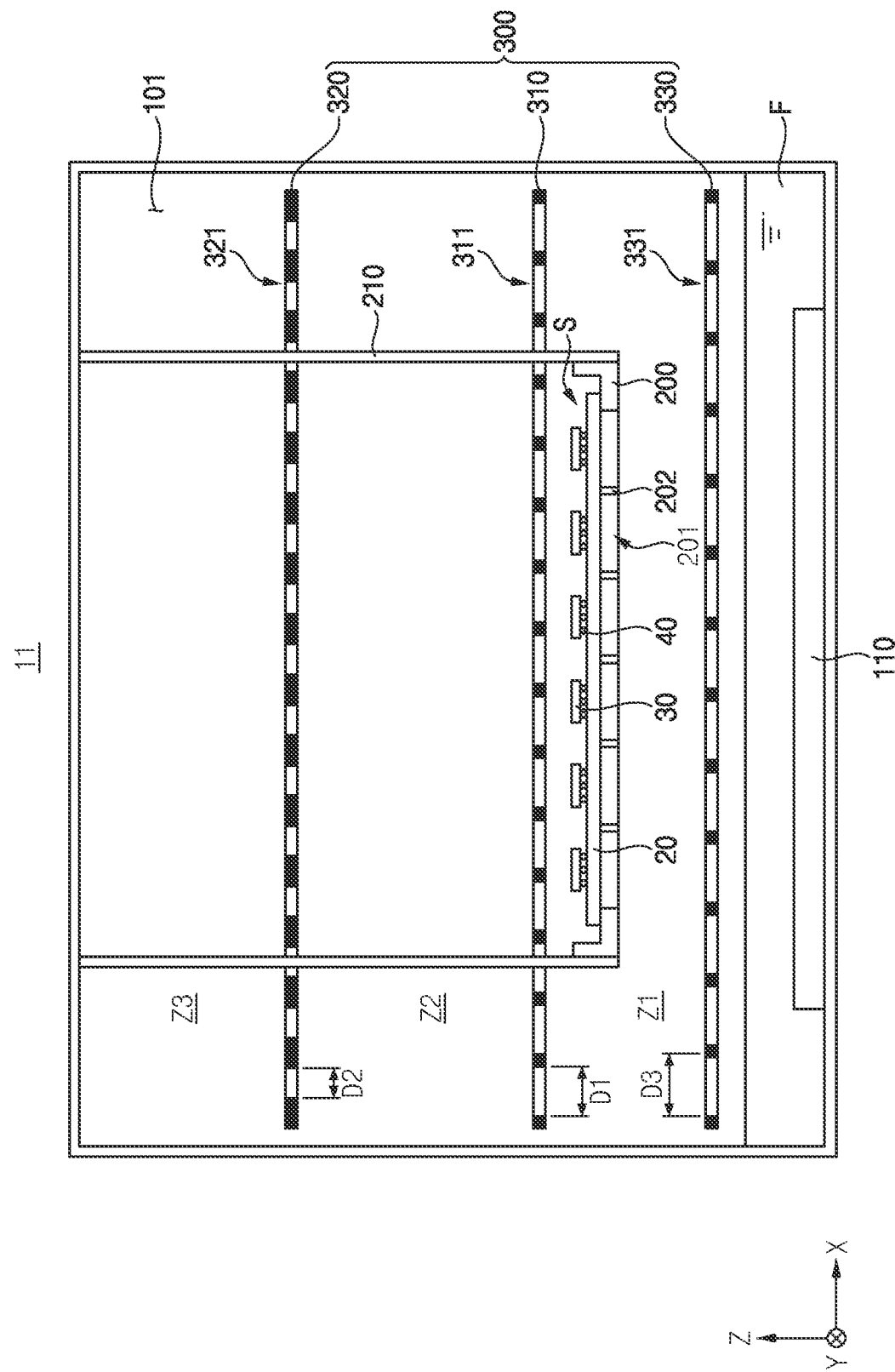
FIG. 13 is a cross-sectional view illustrating a solder reflow apparatus in accordance with example embodiments.

FIG. 13 is a cross-sectional view illustrating a solder reflow apparatus in accordance with example embodiments. The solder reflow apparatus may be substantially the same as or similar to the solder reflow apparatus described with reference to FIG. 1, except for an additional third plate. Thus, same reference numerals will be used to refer to the same or like elements and any further repetitive explanation concerning the above elements will be omitted.

In FIG. 13, a temperature gradient regulator 300 of a solder reflow apparatus 11 may further include a third plate 330 disposed under a first plate 310. In example embodiments, the third plate 330 disposed under the first plate 310 may include a plurality of third openings 331 that have a third size D3 greater than a first size D1. The third plate 330 may have a structure substantially the same as or similar to that of the first plate 310.

A space above the second plate 320 may be defined as a third zone Z3 and may be maintained at a first temperature T1. A space between the first plate 310 and the second plate 320 may be defined as a second zone Z2 and may be maintained at a second temperature T2 higher than the first temperature T1. A space between the third plate 330 and the first plate 310 may be defined as a third zone Z1 and may be maintained at a third temperature T3 higher than the second temperature T2.

In one embodiment, the temperature gradient regulator 300 may further include a fourth plate disposed above the second plate 320 in place of or together with the third plate 330. The fourth plate disposed on the second plate 320 may include a plurality of fourth openings that have a third size smaller than the second size D2.

A space between the second plate 320 and the fourth plate may be defined as the third zone Z3 and may be maintained at the first temperature T1. A space above the fourth plate may be defined as a fourth zone and may be maintained at a fourth temperature lower than the first temperature T1.

Hereinafter, a method of manufacturing an electronic device using the solder reflow apparatus of FIG. 1 will be described. For example, the electronic device is a semiconductor package. However, it will be understood that the manufacturing method of the electronic device in accordance with example embodiments is not limited thereto.

Figure 14:
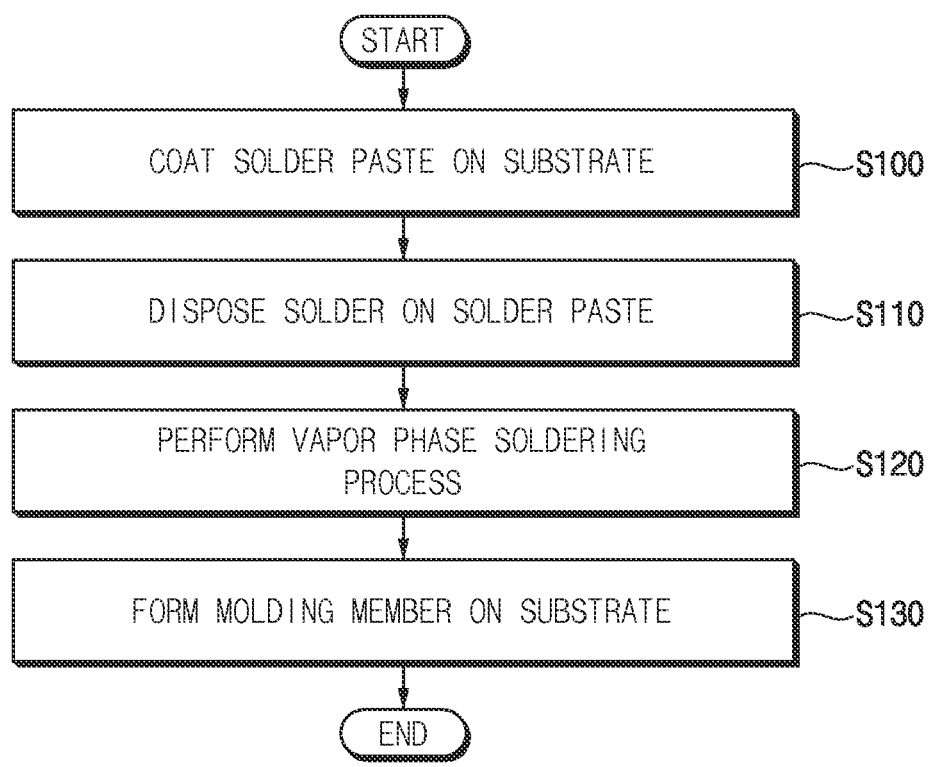
FIG. 14 is a flowchart illustrating a method of manufacturing an electronic device in accordance with example embodiments.
Figure 15:
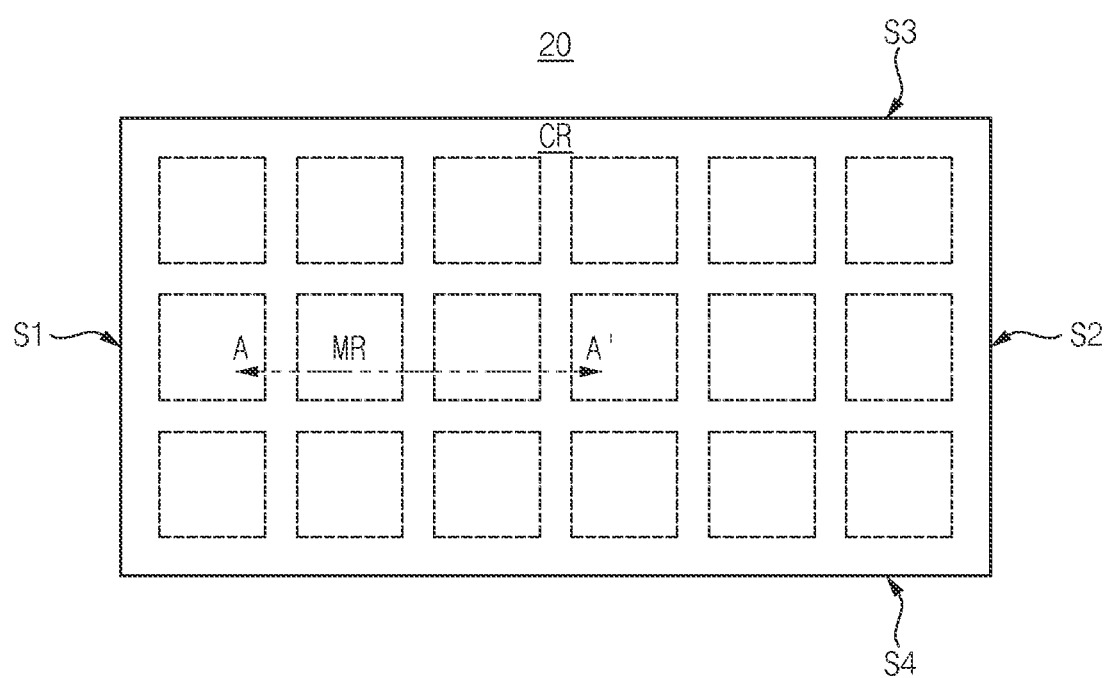
FIGS. 15 to 21 are views illustrating a method of manufacturing an electronic device in accordance with example embodiments.
Figure 16:
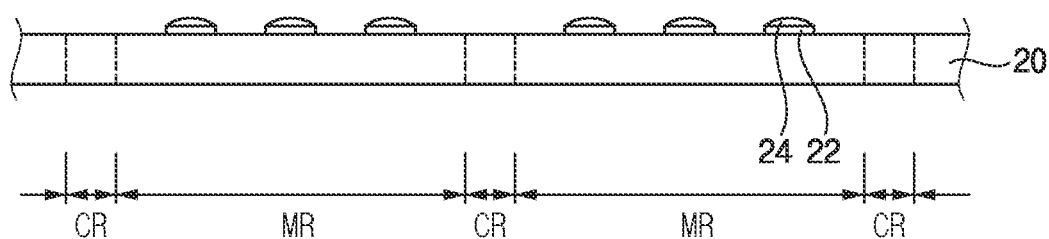
Figure 18:
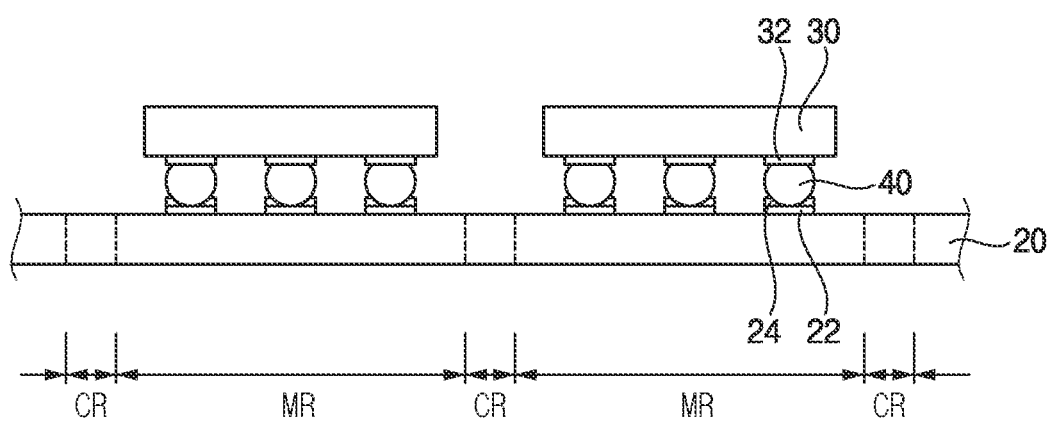
Figure 19:
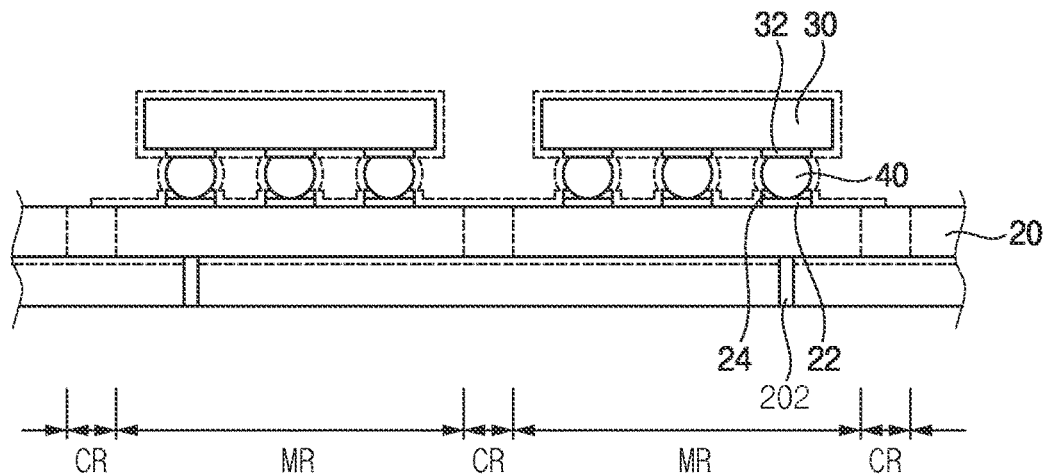

FIG. 14 is a flowchart illustrating a method of manufacturing an electronic device in accordance with example embodiments. FIGS. 15 to 21 are views illustrating a method of manufacturing an electronic device in accordance with example embodiments. FIG. 15 is a plan view illustrating a strip substrate on which semiconductor chips are mounted. FIGS. 16, 18 and 19 are cross-sectional views taken along the line A-A' in FIG. 15.

In FIGS. 14 to 18, first, a substrate 20 including a plurality of substrate pads 22 may be provided, a solder paste 24 may be coated on the substrate pads 22 of the substrate 20 (S100 in FIG. 14), and a solder 40 may be disposed on the solder paste 24 (S110 in FIG. 14).

As illustrated in FIG. 15, the substrate 20 may be a multilayer circuit board as a package substrate having an upper surface and a lower surface opposite to each other. The substrate 20 may be a strip substrate for manufacturing a semiconductor strip such as a Printed Circuit Board (PCB).

The substrate 20 may have first and second side portions S1 and S2 extending in a direction parallel to a second direction parallel to the upper surface and facing each other, and third side portions S3 and S4 extending in a direction parallel to a first direction (X direction) perpendicular to the second direction and facing each other. When viewed from a plan view, the substrate 20 may have a quadrangular shape. The substrate 20 may have a predetermined area (e.g., 77.5 mm×240 mm).

The substrate 20 may include a mounting region MR on which a semiconductor chip is mounted and a cutting region CR surrounding the mounting region MR. A plurality of electronic components (e.g., semiconductor chips) 30 may be disposed on the mounting regions MR of the substrate 20, respectively. For example, tens to hundreds of electronic components (e.g., semiconductor chips) 30 may be arranged in a matrix form on the substrate 20.

As illustrated in FIG. 16, a solder paste 24 may be coated on each of the plurality of substrate pads 22 of the substrate 20. A pitch between the substrate pads 22 of the substrate 20 may be within a range of several tens of microns.

The solder paste 24 may be printed onto the substrate pads 22 of substrate 20. For example, the solder paste 24 may be printed by a stencil printer. A stencil may be a metal foil having a plurality of openings corresponding to an array of solders that are subsequently placed. During printing, the solder paste 24 may be printed to fill the openings of the stencil. The solder paste 24 may include solder power and flux. The flux may include resin, solvent, activator, antioxidant, etc. Alternatively, the solder paste may be coated to a surface of the solder 40 formed on the electronic components (e.g., semiconductor chips) 30.

Figure 17:
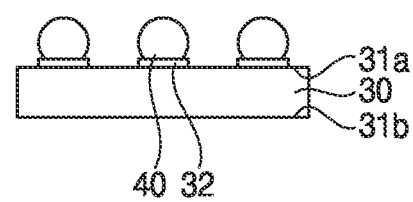

As illustrated in FIG. 17, a solder 40 may be formed on the electronic component 30 mounted on the substrate 20. The electronic component 30 may be a semiconductor chip. Alternatively, the electronic component may be a semiconductor package. In this case, the substrate 20 may be a module board.

A plurality of input/output pads 32 may be formed on a first surface 31a of the electronic component 30. The solders 40 may be respectively formed on the input/output pads 32. After forming an Under Bump Metal (UBM) on the input/output pad 32, the solder 40 may be formed on the under bump metal.

As illustrated in FIG. 18, the electronic component 30 may be disposed on the substrate 20 such that the solder 40 is interposed between the input/output pad 32 of the electronic component 30 and the solder paste 24. The semiconductor chips may be mounted on the substrate 20 by a flip chip bonding method. Then, a vapor phase reflow soldering may be performed (S120).

In FIG. 19, the substrate 20 on which the electronic component 30 is mounted may be loaded into the vapor generating chamber 100 of the solder reflow apparatus 10 of FIG. 1, and while the substrate 20 is sequentially moved to the first to third zones Z3, Z2 and Z1, the heat transfer fluid in a vapor state may be brought into contact with the surface of the substrate 20 to heat the solder paste 24, thereby reflowing the solder 40 and thus, a solder (bump) 40 may be formed between the substrate pad 22 and the input/output pad 32.

In example embodiments, as the substrate is moved through the vertically arranged first to third zones, a desired heating temperature profile over time may be implemented. In particular, after the substrate 20 is loaded, the Galden solution F may be heated by the heater 110 and start to boil. The saturated vapor from the Galden solution may be distributed within the space 101 of the vapor generating chamber 100. At this time, the vapor may be distributed into the first to third zones Z3, Z2 and Z1 through the first and second openings of the first plate 310 and the second plate 320, respectively, and may have a desired constant density in each zone.

Thus, the third zone Z3 above the second plate 320 may be maintained at the first temperature T1, the second zone Z2 between the first plate 310 and the second plate 320 may be maintained at the second temperature T2 higher than the first temperature T1, and the third zone Z1 under the first plate 310 may be maintained at the third temperature T3 higher than the second temperature T3.

After the article S is preheated in the first zone Z3, the article may be moved to the second zone Z2 and activated (soaked). The substrate 20 may be preheated to prevent various soldering defects and to provide a more solid and conductive joint. There may be a secondary vapor phase which is produced at a cooler temperature than the main vapor layer in the first and second zones Z3 and Z3. No soldering takes place in this zone, only a temperature rises.

When the article S is immersed in the vapor in the third zone Z1, the vapor may serves as a heat transfer medium. Since the temperature of the vapor and the temperature of the substrate 20 in the third zone Z1 are different from each other, vapor may be condensed on a surface of the article S to form a layer. The vapor condensing on the surface may transfer latent heat to the surface of the substrate 20 during condensation to reflow a solder paste.

Then, after the solder 40 is soldered, the article S may move to the first zone Z3 via the second zone Z2 and then may be cooled. Accordingly, the solder joints may be cooled down and solidified.

Figure 20:
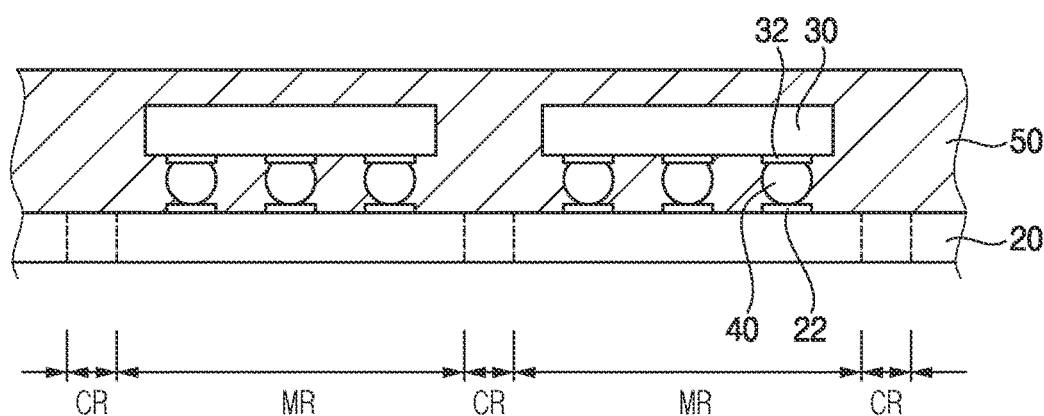

In FIG. 20, a molding member 50 may be formed on the substrate 20 to cover the electronic components (e.g., semiconductor chips) 30 (S130).

In example embodiments, the molding member 50 may be formed on the substrate 20 by a transfer molding apparatus. The substrate 20 may be disposed in a molding space of a mold of the molding apparatus, and a sealing material may flow at high temperature and under high pressure when a lower mold and an upper mold are clamped, so that the liquid sealing material flows inside the molding space and is solidified to form the molding member covering the electronic components (e.g., semiconductor chips) 30. For example, the sealing material may include an Epoxy Mold Compound (EMC).

Figure 21:
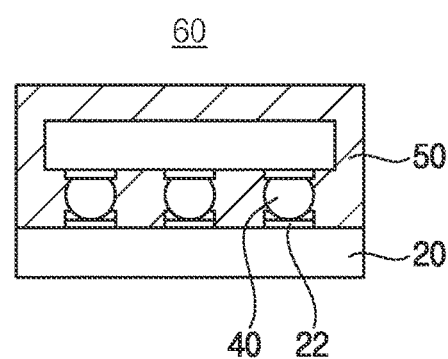

In FIG. 21, the substrate 20 may be sawed by a sawing process to complete semiconductor packages 60. In one embodiment, external connection members such as solder balls may be formed on outer connection pads on a lower surface of the substrate 20, and the cutting region CR of the substrate 20 may be removed by a cutting device such as a blade. Accordingly, the semiconductor packages P may be individualized from the substrate 20.

Through the above processes, a semiconductor package including a logic device or a memory device and a semiconductor module including the same may be manufactured. The semiconductor package may include logic devices such as Central Processing Units (CPUs), Main Processing Units (MPUs), or Application Processors (APs), or the like, and volatile memory devices such as Dynamic Random Access Memory (DRAM) devices, Host Buffer Memory (HBM) devices, or non-volatile memory devices such as flash memory devices, Parallel RAM (PRAM) devices, Magnetic RAM (MRAM) devices, Resistive RAM (ReRAM) devices, or the like.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present disclosure. Accordingly, all such modifications are intended to be included within the scope of example embodiments as defined in the claims.

What is claimed is:

1. An apparatus comprising:
   a vapor generating chamber configured to accommodate a heat transfer fluid and to be filled with saturated vapor generated by the heat transfer fluid;
   a heater configured to heat the heat transfer fluid in the vapor generating chamber;
   a substrate stage configured to be movable upward or downward in the vapor generating chamber and to support a substrate on which an electronic device is mounted via a solder; and
   a temperature gradient regulator comprising at least one mesh plate extending in a horizontal direction in the vapor generating chamber, the at least one mesh plate comprising a plurality of openings through which the vapor moves,
   wherein an inner space of the vapor generating chamber is divided, via the at least one mesh plate, into an upper zone and a lower zone,
   wherein the temperature gradient regulator is configured to maintain a first temperature at the upper zone and a second temperature at the lower zone,
   wherein the second temperature is higher than the first temperature, and
   wherein the substrate on the substrate stage moves through the upper zone and the lower, to thereby obtain a desired solder temperature profile.

2. The apparatus of claim 1, wherein the at least one mesh plate comprises a plurality of cover members that are operable in a retractable manner to allow movement of the substrate stage.

3. The apparatus of claim 2, wherein the at least one mesh plate comprises:
   a pair of first cover members spaced apart from each other to allow the movement of the substrate stage; and
   second cover members respectively installed to be movable on the first cover members to block the movement of the substrate stage.

4. The apparatus of claim 2, wherein the at least one mesh plate comprises cover members having a telescopic structure that operates in a retractable manner.

5. The apparatus of claim 1, wherein:
the at least one mesh plate comprises a first plate and a second plate that are sequentially arranged from a bottom of the vapor generating chamber, and
a space under the first plate is maintained at a first temperature and a space between the first plate and the second plate is maintained at a second temperature lower than the first temperature.

6. The apparatus of claim 5, wherein the first plate comprises a plurality of first openings that have a first size, and the second plate comprises a plurality of second openings that have a second size smaller than the first size.

7. The apparatus of claim 6, wherein an opening area of the first opening is greater than an opening area of the second opening.

8. The apparatus of claim 5, wherein the at least one mesh plate further comprises a third plate disposed under the first plate or above the second plate.

9. The apparatus of claim 1, wherein the substrate comprises a package substrate, and the electronic device comprises a semiconductor chip.

10. An apparatus comprising:
a vapor generating chamber configured to have a heat transfer fluid on a bottom of the vapor generating chamber;
a heater configured to heat the heat transfer fluid to generate saturated vapor from the heat transfer liquid;
a substrate stage configured to be movable upward or downward in the vapor generating chamber and to support a substrate on which an electronic device is mounted via a solder; and
a temperature gradient regulator comprising a first plate and a second plate that are sequentially arranged from the bottom of the vapor generating chamber,
wherein the first plate comprises a plurality of first openings that have a first size, and the second plate comprises a plurality of second openings that have a second size smaller than the first size.

11. The apparatus of claim 10, wherein a space under the first plate is maintained at a first temperature and a space between the first plate and the second plate is maintained at a second temperature lower than the first temperature.

12. The apparatus of claim 10, wherein an opening area of the first opening is greater than an opening area of the second opening.

13. The apparatus of claim 10, wherein the temperature gradient regulator further comprises a third plate disposed under the first plate or above the second plate.

14. The apparatus of claim 13, wherein the third plate under the first plate comprises a plurality of third openings that have a third size greater than the first size.

15. The apparatus of claim 13, wherein the third plate disposed above the second plate comprises a plurality of third openings that have a third size smaller than the second size.

16. The apparatus of claim 10, wherein each of the first and second plates comprises a plurality of cover members that are operable in a retractable manner to allow movement of the substrate stage.

17. The apparatus of claim 10, wherein the heat transfer fluid comprises a Galden solution.

18. The apparatus of claim 10, wherein the substrate comprises a package substrate, and the electronic device comprises a semiconductor chip.

19. An apparatus comprising:
a vapor generating chamber configured to have a heat transfer fluid and in which a saturated vapor generated from the heat transfer fluid is distributed based on a density difference;
a heater configured to heat the heat transfer fluid in the vapor generating chamber;
a substrate stage configured to be movable upward or downward in the vapor generating chamber and to support a substrate on which an electronic device is mounted via a solder; and
at least one mesh plate extending in a horizontal direction in the vapor generating chamber,
wherein the at least one mesh plate comprises a plurality of openings through which the vapor moves and a plurality of cover members that are operable in a retractable manner to allow movement of the substrate stage.

* * * * *